United States Patent

Cheng

[11] Patent Number: 5,837,581
[45] Date of Patent: Nov. 17, 1998

[54] METHOD FOR FORMING A CAPACITOR USING A HEMISPHERICAL-GRAIN STRUCTURE

[75] Inventor: Chih-Hsiung Cheng, Hsinchu, Taiwan

[73] Assignee: Vanguard International Semiconductor Corporation, Hsinchu, Taiwan

[21] Appl. No.: 825,524

[22] Filed: Apr. 4, 1997

[51] Int. Cl.⁶ .............................. H01L 21/8242
[52] U.S. Cl. .......................... 438/255; 438/964
[58] Field of Search .................... 438/253, 255, 438/396, 398, 665, 964

[56] References Cited

U.S. PATENT DOCUMENTS

| | | | |
|---|---|---|---|
| 5,278,091 | 1/1994 | Fazan et al. | 438/255 |
| 5,302,540 | 4/1994 | Ko et al. | 438/255 |
| 5,342,800 | 8/1994 | Jun | 438/964 |
| 5,387,531 | 2/1995 | Rha et al. | 438/964 |

*Primary Examiner*—Chandra Chaudhari
*Attorney, Agent, or Firm*—Christensen, O'Connor, Johnson & Kindness PLLC

[57] ABSTRACT

An improved method for forming a dynamic random access memory (DRAM) capacitor with increased capacitance includes depositing a first oxide layer over a substrate, and patterning a first photoresist layer on the first oxide layer, thereby defining a node contact area. A node trench is etched in the first oxide layer using the first photoresist as a mask. Afterwards, a polysilicon layer is deposited on the first oxide layer, and a second photoresist layer is patterned on this polysilicon layer, defining an electrode area. A hemispherical-grain (HSG) polysilicon layer is deposited on the polysilicon layer and the first oxide layer. The HSG polysilicon layer is then etched back to form a HSG spacer on the sidewalls of the polysilicon layer, and to form a large number of micro-grooves in the upper portion of the polysilicon layer corresponding to the HSG topography of the HSG polysilicon layer. A nitride layer is then conformally deposited to line the micro-grooves. A second oxide layer is then deposited on the nitride layer, filling the nitride-lined micro-grooves with oxide. The second oxide layer is then anisotropically etched back, leaving a nitride/oxide fill in the micro-grooves. The polysilicon layer is then anisotropically etched using the nitride/oxide fill as an etching mask, thereby forming a large number of closely packed narrow trenches in the polysilicon layer. The second oxide layer and the silicon nitride layer are then removed.

17 Claims, 7 Drawing Sheets

METHOD FOR FORMING A CAPACITOR USING A HEMISPHERICAL-GRAIN STRUCTURE

BACKGROUND

1. Field of the Invention

The present invention relates to dynamic random access memory (DRAM) fabrication, and more particularly to a method for forming a capacitor of a DRAM cell using a hemispherical-grain structure.

2. Background Art

Recently, demand for semiconductor devices has rapidly increased owing to widespread use of electronic equipment. In particular, the increasing popularity of some electronic equipment such as computers, for example, is increasing the demand for large semiconductor memories. FIG. 1 shows a simplified diagram of the organization of a typical large semiconductor memory 14. The storage cells of the memory 14 are arranged in an array including horizontal rows and vertical columns. The horizontal lines connected to all of the cells in the row are referred to as word lines 11, and the vertical lines connected to all of the cells in the column are referred to as bit lines 13. Data flow into and out of the cells via the bit lines 13.

Row address 10 and column address 12 are used to identify a location in the memory 14. A row address buffer 15 and a column address buffer 17 respectively receives row address 10 signals and column address 12 signals. The buffers 15 and 17 then drive these signals to a row decoder 16 and column decoder 18, respectively. As is well known in the art of memory design, the row decoder 16 and the column decoder 18 reduce the number of address lines needed for accessing the large number of memory cells in the memory 14. The row decoder 16 and the column decoder 18 then respectively select the appropriate word line and bit line corresponding to the received address signal, thereby selecting a particular memory cell of the memory 14 corresponding to the received address signals.

The array configuration of the semiconductor memory 14 lends itself very well to the regular structure preferred in the "very large scale integration" (VLSI) industry. For example, the memory 14 can be a dynamic random access memory (DRAM). DRAMs have become one of the most widely used types of semiconductor memory due to its low cost per bit, high device density and flexibility of use concerning reading and writing operations.

Early DRAMs used storage cells each consisting of three transistors and were manufactured using P type channel metal-oxide-semiconductor (PMOS) technology. Later, U.S. Pat. No. 3,387,286 titled "FIELD EFFECT TRANSISTOR MEMORY" by R. H. Dennard disclosed a DRAM storage cell structure consisting of one transistor and one capacitor. A circuit schematic diagram of a single transistor-single capacitor structure is shown in FIG. 2A. The memory cell includes a transistor 20, with a capacitor 22 connected to one end of the transistor's channel. The gate of the transistor 20 is controlled by a word line signal, and data, represented by the logic level of the capacitor voltage, is written into or read out of the capacitor 22 through a bit line. FIG. 2B shows cross section of a traditional one-transistor DRAM storage cell that uses a polysilicon layer 24 as one plate of the capacitor. The substrate region under the polysilicon plate 24 serves as the other capacitor electrode. A voltage can be applied to the plate 24 to store a logic value into the capacitor.

As DRAM devices become more highly integrated, the area occupied by a capacitor of a DRAM storage cell typically shrinks. Consequently, the capacitor's capacitance decreases owing to the capacitor's smaller electrode surface area. However, a relatively large capacitance is required to achieve a high signal-to-noise ratio in reading the memory cell and to reduce soft errors (due to alpha particle interference). Therefore, it is desirable to reduce the cell dimension and yet obtain a high capacitance, thereby achieving both high cell integration and reliable operation.

One approach for increasing capacitance while maintaining the high integration of the storage cells is directed toward the shape of the capacitor electrodes. In this approach, the polysilicon layer implementing a capacitor electrode may have protrusions, fins, cavities, etc., to increase the electrode's surface area, thereby increasing the capacitor's capacitance while maintaining the small area occupied by the capacitor on the substrate surface. Consequently, this type of capacitor has come to be widely used in DRAM devices.

In another approach, a hemispherical-grain (HSG) technique is used to increase the surface area of the capacitor electrodes. FIG. 3 shows the cross section of a DRAM cell using a HSG approach. This structure is disclosed in Japanese in the article "*COB structure with HSG Silicon Storage Electrodes*", "Semiconductor World", pp. 134–139, July 1991. HSG silicon is deposited on a doped polysilicon storage node 29 and then anisotropically etched back. Thus, the HSG topography is transferred to the top surface of the doped polysilicon storage node 29, as shown in FIG. 3. Although this DRAM capacitor has some increase in electrode surface area resulting from the rugged surface of the doped polysilicon storage node 29, further increases in electrode surface area are still desirable.

SUMMARY

In accordance with the present invention, a method is provided for forming a DRAM capacitor that substantially increases capacitance. In one embodiment, a first oxide layer is formed over a substrate, and then a first photoresist layer is patterned on the first oxide layer to define a node contact area. A portion of the first oxide layer is removed using the first photoresist layer as a mask to expose the substrate. Thus, a node trench is formed in the first oxide layer. Afterwards, a polysilicon layer is formed on the first oxide layer, filling the node trench in the first oxide layer. Next, a second photoresist layer is patterned on the polysilicon layer, defining an electrode area. Portions of the polysilicon layer are then removed using the second photoresist layer as a mask, exposing portions of the first oxide layer and forming an electrode. Afterwards, a roughly conformal hemispherical-grain (HSG) polysilicon layer is formed over the residual polysilicon layer and the first oxide layer. The HSG polysilicon layer is then etched back until the first oxide layer is exposed, thereby forming a HSG spacer on the sidewalls of the polysilicon layer as well as a large number of micro-grooves in the upper portion of the residual polysilicon layer.

A relatively thin silicon nitride layer is then conformally formed on the first oxide layer, the HSG spacer and the residual polysilicon layer. A second oxide layer is then formed on the conformal silicon nitride layer, filling the nitride-lined micro-grooves with oxide. The second oxide layer is anisotropically etched back until the silicon nitride layer surrounding the residual polysilicon layer is exposed, thereby forming an oxide/nitride spacer around the HSG spacer and leaving residual oxide/nitride "fill" in the micro-grooves. The exposed portions of the nitride layer are then removed. Then an anisotropic polysilicon etching process is performed, using the oxide/nitride fill and the oxide/nitride spacer as etching masks Thus, portions of the polysilicon layer are removed, forming narrow trenches in the residual polysilicon layer. The residual second oxide layer is removed and then the residual silicon nitride layer is removed, with the resulting polysilicon structure forming the bottom electrode of a DRAM cell capacitor. The dielectric layer and top electrode of the DRAM cell capacitor are then formed in a standard manner. In this embodiment, an ONO dielectric layer is formed on the bottom electrode, and then a doped polysilicon layer is formed on the ONO layer to form the top electrode. Because the fill in the micro-grooves is used as a mask, a large number of extremely narrow trenches (and associated vertical fins) are formed in the bottom electrode, thereby advantageously increasing the electrode surface area of the capacitor.

DETAILED DESCRIPTION

Figure 1:
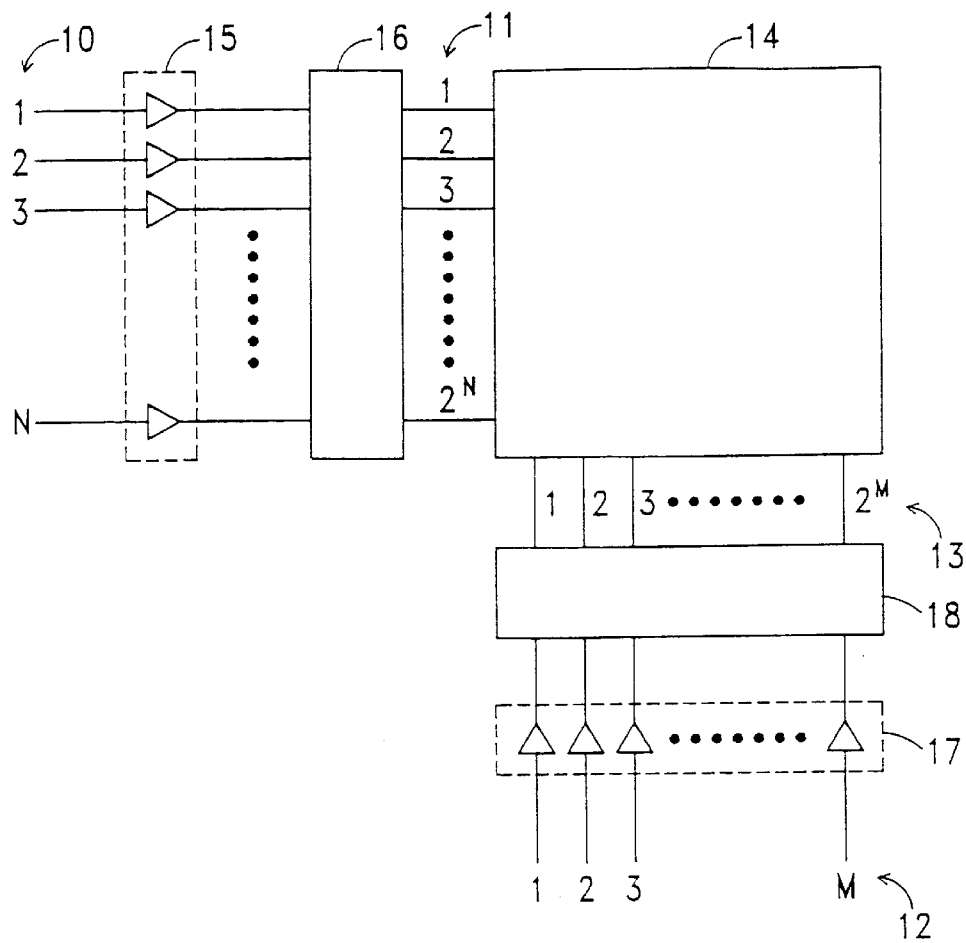
FIG. 1 shows a simplified diagram of the organization of large semiconductor memories.
Figure 2A:
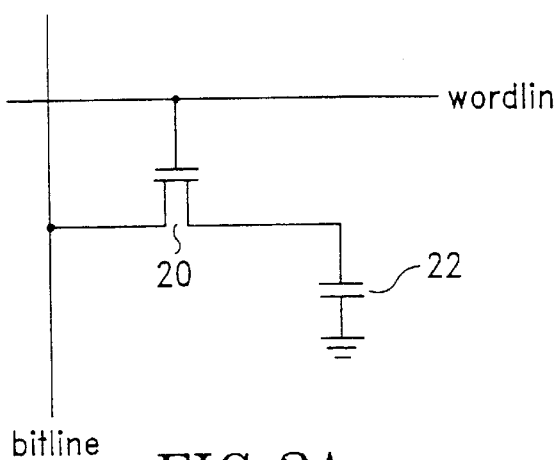
FIG. 2A shows a circuit schematic diagram of a dynamic random access memory (DRAM).
Figure 2B:
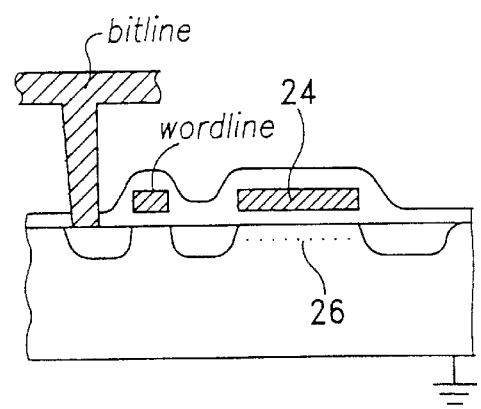
FIG. 2B shows the cross section of a traditional one-transistor DRAM storage cell.
Figure 3:
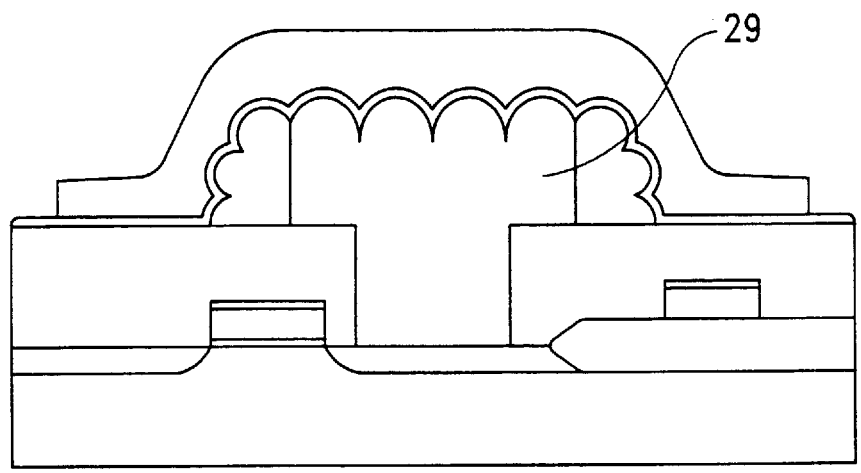
FIG. 3 shows the cross section of a conventional DRAM cell capacitor fabricated using a hemispherical-grain (HSG) technique.
Figure 4:
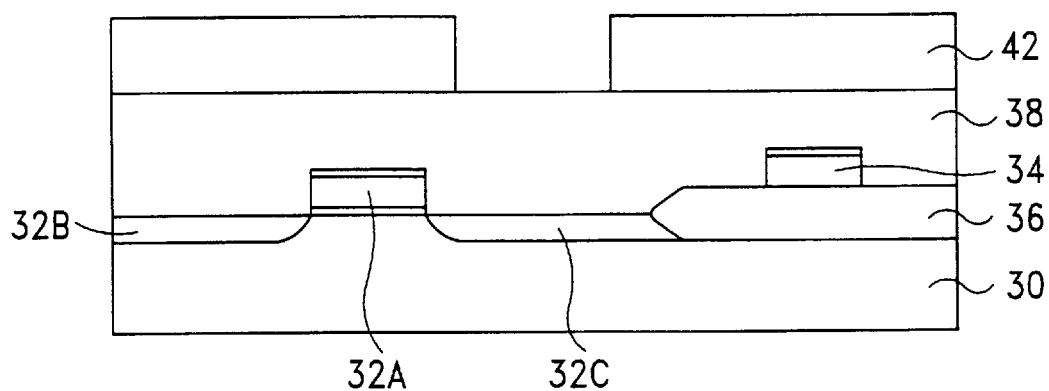
FIGS. 4 to 13 show cross-sectional views illustrative of various stages in the fabrication of a DRAM capacitor in accordance with one embodiment of the present invention.

Referring to FIG. 4, a metal-oxide-semiconductor field effect transistor (MOSFET) having a gate 32A, a drain 32B and a source 32C, is conventionally formed in and on the substrate 30. In addition, a field oxide (FOX) region 36 is conventionally formed in the substrate 30 adjacent to the source 32C. A word line 34 is formed on the FOX region 36. Typically, the word line 34 is made of doped polysilicon. In this embodiment, the MOSFET is a n-channel MOSFET that forms part of a dynamic random access memory (DRAM) cell. A dielectric layer such as an oxide layer 38 is formed over the MOSFET and on the substrate 30 using a chemical vapor deposition (CVD) method, typically to a thickness of about 3000 to 8000 angstroms. The oxide layer 38 is then planarized by a conventional planarization method such as, for example, chemical mechanical polishing (CMP) to reduce the topography and aid in subsequent photolithography processes. Afterwards, conventional photolithography techniques are used to define a storage node contact area in a photoresist layer 42 formed on the oxide layer 38. The photoresist layer 42 is patterned to expose a portion of the oxide layer 38 over the source 32C. In order to fabricate a high density DRAM, the width of the exposed portion of the oxide layer 38 is chosen at or near the minimum feature size of the photolithography technique. In other embodiments, the storage node contact can be fabricated using other suitable techniques.

Using the photoresist layer 42 as an etching mask, the oxide layer 38 is anisotropically etched. A node trench 44 is thus formed in the oxide layer 38 as shown in FIG. 5, exposing a portion of the source region 32C.

Figure 5:
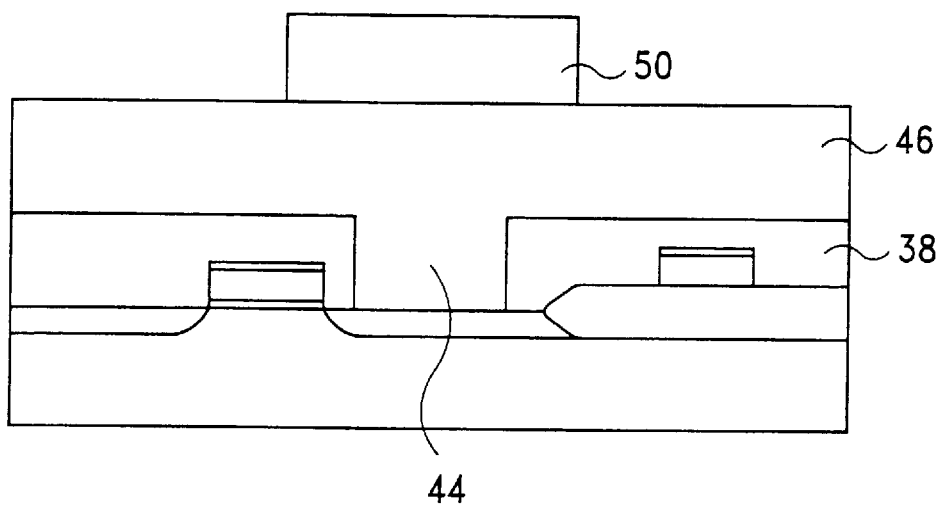

A relatively thick doped polysilicon layer 46, shown in FIG. 5, is formed over the oxide layer 38 so as to fill the trench 44. The nominal thickness of the doped polysilicon layer 46 above the oxide layer 38 is about 2000 to 10000 angstroms. Typically, the polysilicon layer 46 is doped with phosphorus dopants at a concentration of about 5E20 to increase conductivity. Afterwards, conventional photolithography techniques are used to define an electrode area in a photoresist layer 50 formed on the doped polysilicon layer 46. Using the photoresist layer 50 as a mask, the doped polysilicon layer 46 is anisotropically etched to form a polysilicon electrode 46A (see FIG. 6) of a DRAM cell capacitor. In this embodiment, a plasma etch process with etchant of $SF_6/O_2$ is used.

Figure 6:
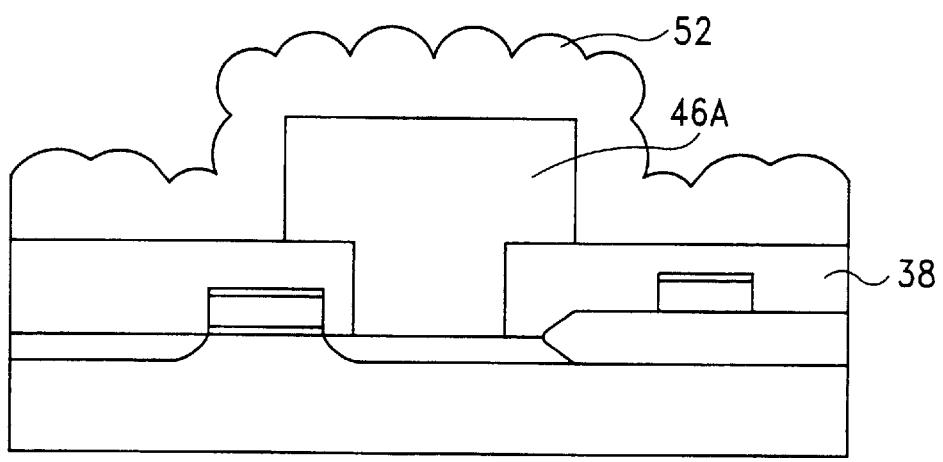

Referring to FIG. 6, a hemispherical-grain (HSG) polysilicon layer 52 is formed on the polysilicon electrode 46A and the oxide layer 38 using a conventional CVD process with a temperature of about 530° C.–600° C. and a pressure less than 1 Torr. In this embodiment, the HSG polysilicon layer 52 has a thickness of about 500~3000 angstroms. Typically, the HSG polysilicon layer 52 is doped with phosphorus dopants at a concentration of about 5E20 to increase conductivity.

Figure 7:
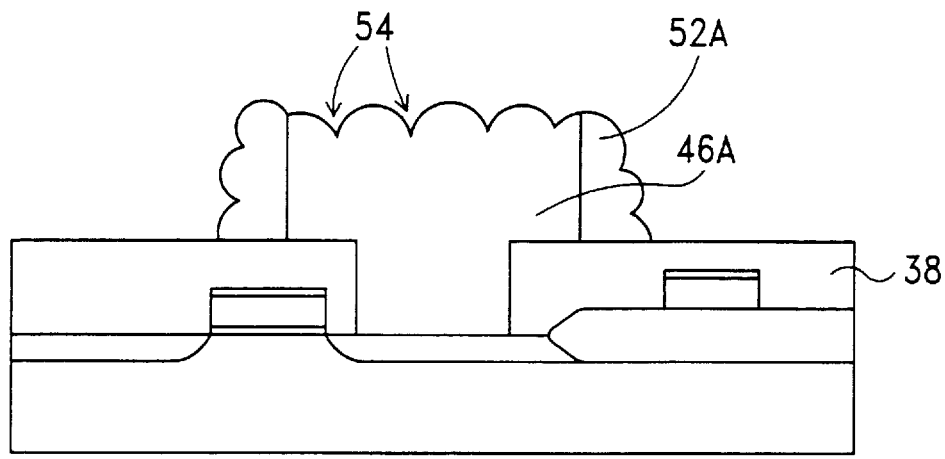

Referring to FIG. 7, the HSG polysilicon layer 52 is then anisotropically etched back until the oxide layer 38 is exposed, thereby forming an HSG polysilicon spacer 52A on the sidewalls of the polysilicon electrode 46A, the bottom electrode. In this embodiment, the etch process is performed using a conventional anisotropic dry etch method. The topography of the HSG polysilicon layer 52 is thus transferred into the upper surface of the polysilicon electrode 46A, forming a large number of micro-grooves 54 in the upper portion of the polysilicon electrode 46A. In this embodiment, the size of the micro-grooves of the HSG topography is about some hundreds to thousands angstroms in depth and about 100–1000 angstroms in width across the top of the micro-groove, which is generally much smaller than the minimum dimension of current photolithography processes.

Figure 8:
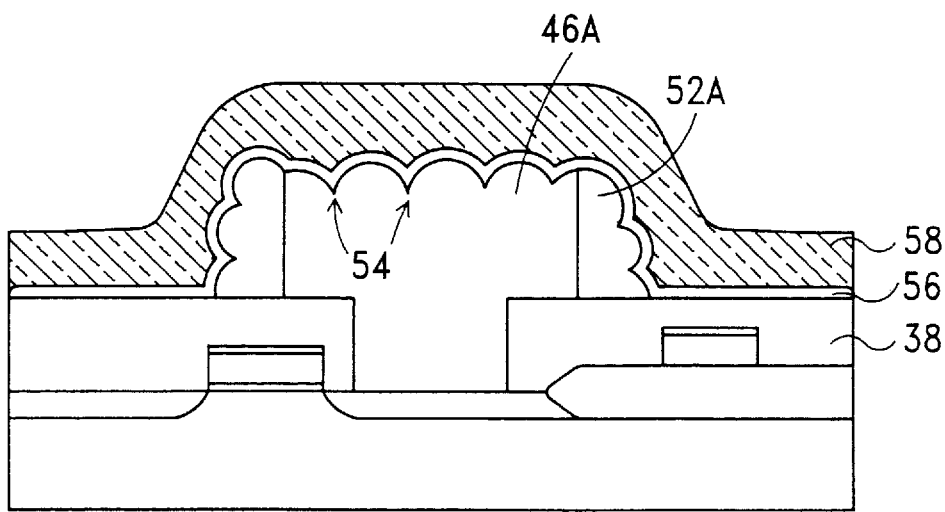

Next, a thin silicon nitride layer 56 is conformally deposited on the oxide layer 38, the HSG spacer 52A and the polysilicon electrode 46A using a conventional low pressure chemical vapor deposition (LPCVD) process or a plasma enhanced chemical vapor deposition (PECVD) process. As shown in FIG. 8, the nitride layer 56 preferably conformally lines the micro-grooves 54 of the HSG topography of the polysilicon electrode 46A and the HSG spacer 52A. In this embodiment, the thickness of the silicon nitride layer 56 is about 200 angstroms, but a thickness in the range of about 100-to-900 angstroms can be used. Afterwards, a thick oxide layer 58 is formed on the silicon nitride layer 56, filling the nitride-lined micro-grooves 54. In this embodiment, the oxide layer 58 is formed using a conventional CVD method to a thickness of about 300~3000 angstroms.

Figure 9:
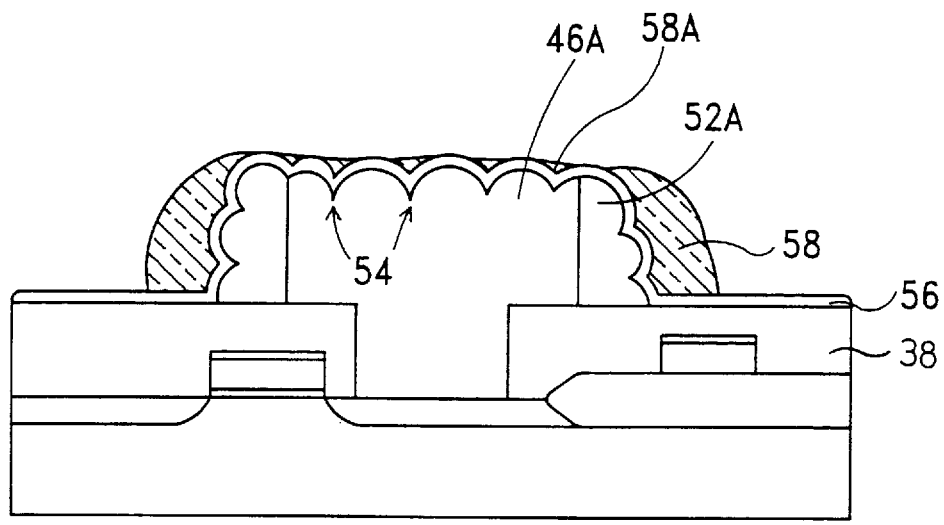

Afterwards, the oxide layer 58 is anisotropically etched back, exposing portions of the silicon nitride layer 56 contacting the oxide layer 38 and on the peaks of the HSG topography. As shown in FIG. 9, this etching process forms an oxide spacer 58A around the HSG spacer 52A. In addition, this etching process leaves some oxide 58B in the micro-grooves 54 (referred to herein as oxide "fill"). In this embodiment, the thick oxide layer 58 is etched using an anisotropic dry etching process to form the oxide spacer 58A and the oxide fill 58B.

Figure 10:
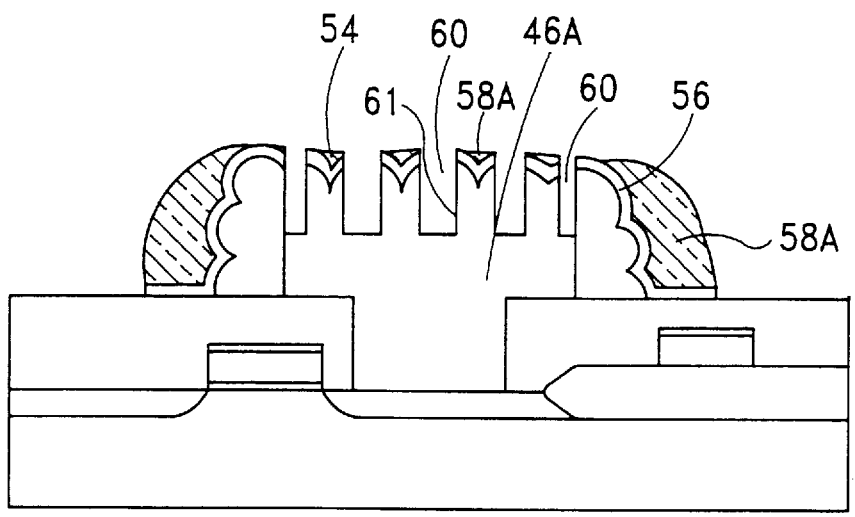

The silicon nitride layer 56 is etched using a conventional anisotropic dry etching process, and a standard anisotropic etching process is further performed to anisotropically etch the polysilicon electrode 46A using the oxide spacer 58A and the oxide fill 58B in the micro-grooves 54 as an etching mask. As a result of this polysilicon etching process, trenches 60 are formed in the polysilicon electrode 46A, with vertically extending fins 61 formed between adjacent trenches 60, asapprox in FIG. 10. The trenches 60 have a width approximately equal to the width of the exposed HSG peaks, whereas the fins have a width approximately equal to the width of the residual. The surface area of the polysilicon electrode 46A is thus advantageously increased. In addition, the trenches 60 are typically significantly smaller than the minimum dimension of current photolithography processes, thereby allowing more trenches to be formed in the polysilicon electrode 46A than with these conventional photolithographic processes. Because more trenches can be formed, the electrode surface area can be more greatly increased.

Figure 11:
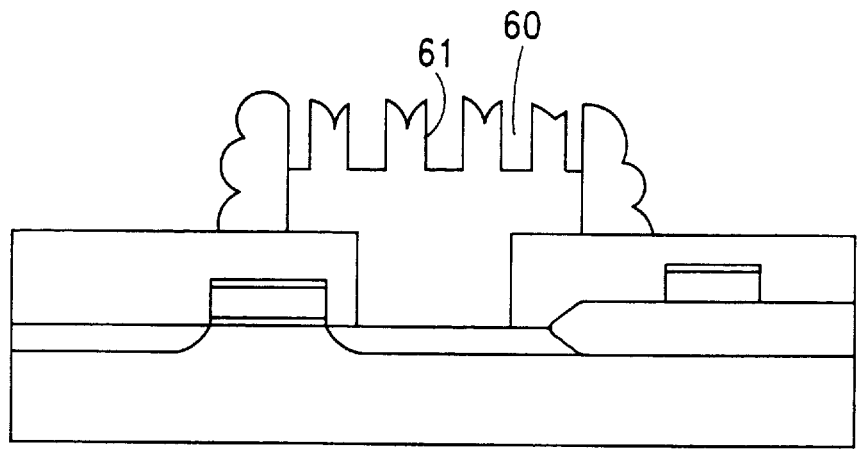

Afterwards, the oxide spacer 58A, the oxide fill 58B in the micro-grooves 54 and the residual portions of the silicon nitride layer 56 are removed using conventional wet etch methods, resulting the structure shown in FIG. 11. In this embodiment, the nominal width of the trenches 60 is about 500 angstroms, although widths in the range of 100 ~1000 angstroms can be obtained. The nominal width of the fins 61 is about 500. The relatively large number of narrow trenches significantly increases the surface area of the electrode compared to other conventional methods, thereby increasing the capacitance of the capacitor. In this embodiment, the oxide is removed using a standard wet etch process, while the nitride is removed using a standard wet etch process.

Figure 12:
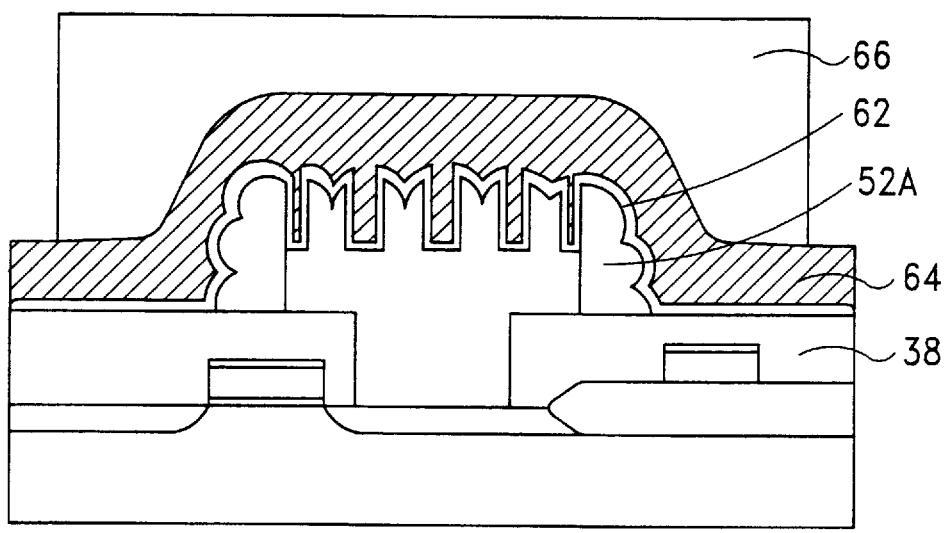

Referring to FIG. 12, the remaining elements of the DRAM cell capacitor are formed as follows. A dielectric film 62 and the top electrode 64 of the DRAM cell capacitor can be formed in any suitable conventional manner. In this embodiment, the dielectric layer 62 is a conventional stacked oxide-nitride-oxide (ONO) film. As is known in the art of DRAM fabrication, ONO film is reliable over shaped silicon surfaces and, thus, is commonly used as a capacitor dielectric. The bottom oxide layer of the stacked ONO dielectric layer 62 is conventionally formed by thermally oxidizing the exposed surface of the bottom electrode (formed by the polysilicon electrode 46A and the HSG spacer 52A). Then a silicon nitride layer if formed on the thermally grown oxide by LPCVD. The silicon nitride layer is then oxidized to form the top oxide layer of the ONO dielectric layer 62. A conductive layer 64 is then deposited over the ONO dielectric layer 62 to serve as an upper plate of the DRAM cell capacitor. Typically, the conductive layer 64 is a doped polysilicon layer formed in the same manner as the polysilicon layer 46.

Figure 13:
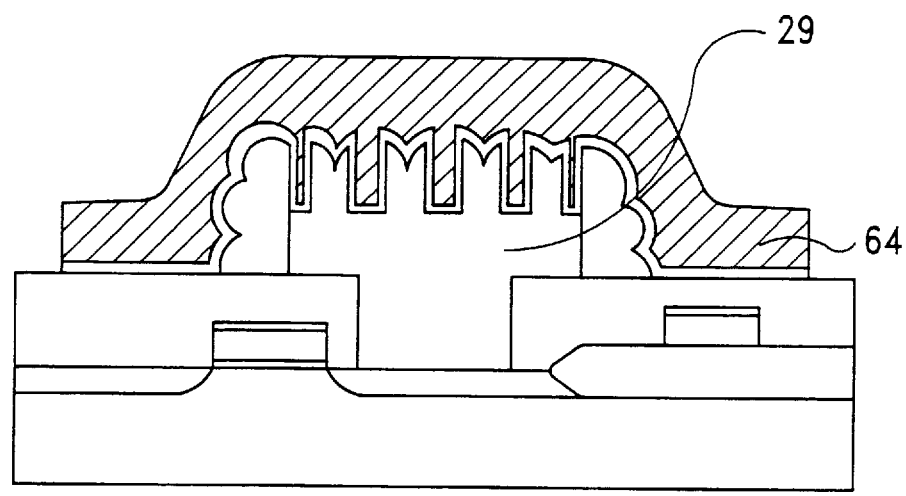

To complete the fabrication of the DRAM cell capacitor, a photoresist layer is patterned on the polysilicon layer 64 to form a photoresist mask 66, covering the bottom electrode. The portions of the polysilicon layer 64 not covered by the photoresist mask 66 are removed by a standard dry etching process using the photoresist mask 66 as an etching mask. The resulting structure is shown in FIG. 13.

Although specific embodiments including the preferred embodiment have been illustrated and described, it will be appreciated by those skilled in the art that various modifications may be made without departing from the spirit and scope of the present invention, which is intended to be limited solely by the appended claims.

What is claimed is:

1. A method for forming a capacitor in an integrated circuit, said method comprising:

forming a first oxide layer over a substrate;

forming a first photoresist layer over said first oxide layer, said photoresist layer defining a node contact area;

removing a portion of said first oxide layer using said first photoresist layer as a mask, thereby forming a node trench in said first oxide layer, said node trench exposing a portion of said substrate;

forming a polysilicon layer on said first oxide layer, said polysilicon layer filling said node trench in said first oxide layer;

forming a second photoresist layer on said polysilicon layer, said second photoresist layer defining an electrode area;

removing portions of said polysilicon layer left uncovered by said second photoresist layer, wherein portions of said first oxide layer uncovered by said second photoresist layer are exposed;

forming a hemispherical-grain (HSG) polysilicon layer on said polysilicon layer and said exposed portions of said first oxide layer;

etching back said HSG polysilicon layer until portions of said first oxide layer are exposed, wherein a plurality of grooves is formed in an upper portion of said polysilicon layer, said plurality of grooves corresponding to grooves between grains of said HSG polysilicon layer;

forming a conformal silicon nitride layer on said first oxide layer and said polysilicon layer, wherein said silicon nitride layer lines said plurality of grooves;

forming a second oxide layer on said silicon nitride layer, wherein said plurality of nitride-lined grooves is filled with oxide of said second oxide layer;

anisotropically etching back said second oxide layer until portions of said silicon nitride layer aligned between said plurality of grooves are exposed, wherein residual oxide from said second oxide layer remains in said plurality of nitride-lined grooves;

removing said exposed portions of said silicon nitride layer, wherein portions of said polysilicon layer are exposed;

anisotropically etching said exposed portions of said polysilicon layer using said residual oxide in said plurality of nitride-lined grooves as a mask, wherein a plurality of trenches is formed in the polysilicon layer aligned between said plurality of nitride-lined grooves;

removing said residual oxide;

removing remaining portions of said silicon nitride layer;

forming a conformal dielectric layer on said polysilicon layer; and forming a conductive layer on said dielectric layer.

2. The method according to claim 1, wherein said substrate comprises a metal-oxide-semiconductor transistor formed in and on the substrate, said metal-oxide-semiconductor transistor being a part of a dynamic random access memory cell.

3. The method according to claim 1, wherein said HSG polysilicon layer is formed using a chemical vapor deposition process with a temperature in a range of about 530°~600° C.

4. The method according to claim 1, wherein said silicon nitride layer has a thickness in a range of about 100~900 angstroms.

5. The method according to claim 1, wherein each trench of said plurality of trenches has a width in a range of about 100~1000 angstroms.

6. The method according to claim 1, wherein adjacent trenches of said plurality of trenches define a plurality of vertically extending fins, each vertically extending fin of said plurality of vertically extending fins having a width of 500 angstroms.

7. The method according to claim 1, wherein said conformal dielectric layer comprises an oxide-nitride-oxide layer.

8. The method according to claim 1, wherein a HSG spacer is formed on a sidewall of said polysilicon layer when said HSG polysilicon layer is etched back.

9. The method according to claim 8, wherein said nitride and second oxide layers are formed on said HSG spacer.

10. The method according to claim 9, wherein an oxide spacer is formed around said HSG spacer when said second oxide layer is anisotropically etched back.

11. A method for forming a capacitor in an integrated circuit, said method comprising:

forming a first oxide layer over a substrate;

forming a first photoresist layer over said first oxide layer, said photoresist layer defining a node contact area;

removing a portion of said first oxide layer using said first photoresist layer as a mask, thereby forming a node trench in said first oxide layer, said node trench exposing a portion of said substrate;

forming a polysilicon layer on said first oxide layer, said polysilicon layer filling said node trench in said first oxide layer;

forming a second photoresist layer on said polysilicon layer, said second photoresist layer defining an electrode area;

removing portions of said polysilicon layer left uncovered by said second photoresist layer, wherein portions of said first oxide layer uncovered by said second photoresist layer are exposed;

forming a hemispherical-grain (HSG) polysilicon layer on said polysilicon layer and said exposed portions of said first oxide layer;

etching back said HSG polysilicon layer until portions of said first oxide layer are exposed, wherein a HSG spacer is formed on a sidewall of said polysilicon layer and wherein a plurality of grooves is formed in an upper portion of said polysilicon layer, said plurality of grooves corresponding to grooves between grains of said HSG polysilicon layer;

forming a conformal silicon nitride layer on said first oxide layer, said HSG spacer and said polysilicon layer, wherein said silicon nitride layer lines said plurality of grooves in said polysilicon layer;

forming a second oxide layer on said silicon nitride layer, wherein said plurality of nitride-lined grooves is filled with oxide of said second oxide layer;

anisotropically etching back said second oxide layer until a portion of said silicon nitride layer surrounding said HSG spacer is exposed, wherein residual oxide from said second oxide layer remains in said plurality of nitride-lined grooves and portions of said silicon nitride layer aligned between said nitride-lined grooves are exposed;

removing said exposed portions of said silicon nitride layer, wherein portions of said polysilicon layer are exposed;

anisotropically etching said exposed portions of said polysilicon layer using said residual oxide in said plurality of nitride-lined grooves as a mask, wherein a plurality of trenches is formed in the polysilicon layer aligned between said plurality of nitride-lined grooves;

removing said residual oxide;

removing remaining portions of said silicon nitride layer;

forming a conformal dielectric layer on said polysilicon layer; and forming a conductive layer on said dielectric layer.

12. The method according to claim 11, wherein said substrate comprises a metal-oxide-semiconductor transistor formed in and on the substrate, said metal-oxide-semiconductor transistor being a part of a dynamic random access memory cell.

13. The method according to claim 11, wherein said HSG polysilicon layer is formed using a chemical vapor deposition process with a temperature in a range of about 530°~600° C.

14. The method according to claim 11, wherein said silicon nitride layer has a thickness in a range of about 100~900 angstroms.

15. The method according to claim 11, wherein each trench of said plurality of trenches has a width in a range of about 100~1000 angstroms.

16. The method according to claim 11, wherein adjacent trenches of said plurality of trenches define a plurality of vertically extending fins, each vertically extending fin of said plurality of vertically extending fins having a width of about 500 angstroms.

17. The method according to claim 11, wherein said conformal dielectric layer comprises an oxide-nitride-oxide layer.

* * * * *